United States Patent [19]

Ikegaya et al.

[11] Patent Number: 5,981,041
[45] Date of Patent: Nov. 9, 1999

[54] MULTILAYER PRINTED CIRCUIT BOARD AND PROCESS FOR PRODUCING AND USING THE SAME

[75] Inventors: Kunio Ikegaya, Shizuoka-ken; Shigeru Egusa; Yoshiyuki Takahashi, both of Fujieda, all of Japan

[73] Assignee: Sumitomo Bakelite Company Limited, Tokyo, Japan

[21] Appl. No.: 08/740,321

[22] Filed: Oct. 28, 1996

[30] Foreign Application Priority Data

Oct. 31, 1995 [JP] Japan ................................ 7-284227
Oct. 31, 1995 [JP] Japan ................................ 7-284229
Jun. 18, 1996 [JP] Japan ................................ 8-156573

[51] Int. Cl.$^6$ ........................ B32B 9/00; H05K 1/02
[52] U.S. Cl. ...................... 428/209; 428/220; 428/416; 428/418; 428/901; 174/259
[58] Field of Search .................... 428/209, 220, 428/416, 418, 901; 174/259

[56] References Cited

U.S. PATENT DOCUMENTS 4,767,805   8/1988   Tada et al. ............................ 523/206
5,075,159  12/1991   Koyama et al. ....................... 428/209
5,098,781   3/1992   Minnick et al. ...................... 428/901
5,270,493  12/1993   Inoue et al. ......................... 174/253
5,308,565   5/1994   Weber et al. ......................... 264/115

*Primary Examiner*—Deborah Jones
*Assistant Examiner*—Cathy F. Lam
*Attorney, Agent, or Firm*—Browdy and Neimark

[57] ABSTRACT

A multilayer printed circuit board is obtained by impregnating a base material with a thermosetting resin in to form a prepreg; applying an undercoating agent comprising a terminal-bifunctional linear epoxy resin having an average epoxy equivalent of 450 to 6,000, together with at least one of 2-undecylimidazole, 1-cyanoethy1-2-undecylimidazole or 2,4-diamino-6{2'-undecyl-imidazole(1')}ethyl-s-triazine, or the aforementioned components together with an aromatic polyamine, to at least one circuit side of an interlayer circuit board on at least one side of which a circuit has been formed; and laying the prepreg on at least one side of the undercoating agent-applied interlayer circuit board and subjecting them to laminating.

14 Claims, No Drawings

MULTILAYER PRINTED CIRCUIT BOARD AND PROCESS FOR PRODUCING AND USING THE SAME

FIELD OF THE INVENTION

The present invention relates to a process for producing a multilayer printed circuit board which is excellent in adhesion property of the undercoating agent to copper foil in interlayer circuit board and does not necessitate a black oxide treatment, a multilayer printed circuit board, and a process for using the multilayer printed circuit board.

BACKGROUND OF THE INVENTION

The multilayer printed circuit boards have generally been manufactured by a process comprising the steps of applying an oxidizing treatment, or so-called black oxide treatment, on both sides of a core substrate board on which circuit has been formed and which is used as an interlayer circuit board (i.e., roughening the circuit surface), laying thereon one or more sheets of prepreg obtained by impregnating a thermosetting resin in a base material, further laying thereon a metal foil, and subjecting the assembly to hot pressing. The purpose of the black oxide treatment is to achieve good adhesion property between the interlayer circuit board and the prepreg. Since the interlayer circuit board without the black oxide treatment almost showed no adhesion property to the prepreg, this black oxide treatment has been an essential technique for the manufacture of multilayer printed circuit boards. This technique makes use of the oxidation phenomenon initiated by a chemical treatment of the surface copper foil of an interlayer circuit board (a copper-clad laminate in which circuit has been formed and which is used as interlayer circuit board), and practically it involves very difficult control of the process and requires a great deal of equipment investment and running cost. The fact has also been pointed out that since copper oxide has a poor acid resistance and also is low in physical strength, troubles tend to occur during the multilayer molding, drilling and through-hole plating operations.

There have also been known the multilayer printed circuit boards producing methods featuring formation of a resin layer on the surface of the interlayer circuit board, as for instance disclosed in JP-A-53-132772, JP-A-60-62194 and JP-A-63-108796. However, in any of these prior art proposals, it has been intended to improve dielectric strength, haloing resistance, or heat dispersibility, by suppressing formation of voids in the molding operation, or to increase insulating layer thickness, and those purposes are different from those of the present invention.

The present invention relates to a multilayer printed circuit board which is excellent in adhesion property of the undercoating agent to copper foil in interlayer circuit board and thereby, in which the black oxide treatment is not required. In order to solve the problems involved in the multilayer printed circuit board such as adhesion property to the copper foil in interlayer circuit board, especially that to which no black oxide treatment has been applied, heat resistance under moisture absorption, plating solution resistance, and delamination, the present inventors have made extensive researches on the composition of undercoating agent and could reach the present invention.

SUMMARY OF THE INVENTION

The present invention provides a process for producing a multilayer printed circuit board, comprising the steps of:

impregnating a thermosetting resin in a base material to form a prepreg, applying an undercoating agent comprising
- (a) a terminal-bifunctional linear epoxy resin having an average epoxy equivalent of from 450 to 6,000 and
- (b) at least one component selected from the group consisting of 2-undecylimidazole, 1-cyanoethyl-2-undecylimidazole and 2,4-diamino-6-{2'-undecyl-imidazole(1')} ethyl-s-triazine, or
- (a) a terminal-bifunctional linear epoxy resin having an average epoxy equivalent of from 450 to 6,000,
- (b) an aromatic polyamine and
- (c) at least one component selected from the group consisting of 2-undecylimidazole, 1-cyanoethyl-2-undecylimidazole and 2,4-diamino-6-{2'-undecyl-imidazole(1')}ethyl-s-triazine to at least one circuit side of an interlayer circuit board on at least one side of which circuit has been formed, laying the prepreg on at least one side of the undercoating agent-applied interlayer circuit board and subjecting them to laminating press.

The present invention also provides a multilayer printed circuit board comprising an interlayer circuit board and a prepreg, wherein the prepreg is obtained by impregnating a thermosetting resin in a base material, the multilayer printed circuit board is obtained by applying an undercoating agent comprising
- (a) a terminal-bifunctional linear epoxy resin having an average epoxy equivalent of from 450 to 6,000 and
- (b) at least one component selected from the group consisting of 2-undecylimidazole, 1-cyanoethyl-2-undecylimidazole and 2,4-diamino-6-{2'-undecyl-imidazole(1')}ethyl-s-triazine to at least one circuit side of an interlayer circuit board on at least one side of which circuit has been formed, laying the prepreg on at least one side of the undercoating agent-applied interlayer circuit board and subjecting them to laminating press, and the multilayer printed circuit board has a good balance between adhesion property of the undercoating agent to copper foil in an interlayer circuit board, heat resistance under moisture absorption, and plating solution resistance.

The present invention further provides a process for using a multilayer printed circuit board, comprising the step of applying the aforesaid multi-layer printed circuit board to cameras, facsimiles, duplicating machines, word processors or computers.

DETAILED DESCRIPTION OF THE INVENTION

A detailed description of the present invention follows.

As the result of extensive research on compositions of underocoating agents, the present inventors found that a satisfactory adhesion property to copper foil in an interlayer circuit board and heat resistance can be obtained by the use of a combination of a terminal-bifunctional linear epoxy resin having an epoxy equivalent in the definite range and the specific imidazole compound as the undercoating agent, or a combination further including an aromatic polyamine, not only when black oxide treatment is performed on the interlayer circuit board but also even when no black oxide treatment is provided.

As the epoxy resin in the present invention, there can be used the terminal-bifunctional linear epoxy resins having an average epoxy equivalent of 450–6,000, for example, bifunctional linear epoxy resins obtained by reacting bifunctional phenols with epihalohydrin and terminal-bifunctional linear epoxy resins obtained from alternating copolymerization reaction of bifunctional epoxy resins with bifunctional phenols. It is possible to use combinations of several types of these resins. Exemplary of said epoxy resins are bisphenol A type epoxy resins, bisphenol F type epoxy resins, tetrabromobisphenol A type epoxy resins, propylene oxide bisphenol A type epoxy resins, bisphenol S type epoxy resins, biphenyl type epoxy resins, 2,6-naphthol type diglycidyl ether polymers, bisphenol A type epoxy resin and tetrabromobisphenol A copolymer, bisphenol F type epoxy resin and tetrabromobisphenol A copolymer, and bisphenol S type epoxy resin and tetrabromobisphenol A copolymer. It is possible to blend epoxy resins having a low epoxy equivalent (low molecular weight) such as diglycidyl ether of bisphenol A as far as their average epoxy equivalent falls within the above-defined range. Also, brominated epoxy reins may be used for providing flame retardancy.

Molecular weight and epoxy equivalent of the epoxy resins used in the present invention is discussed. The present inventors found that a greater molecular weight tends to provide a higher degree of adhesion property (to copper without black oxide treatment) but on the other hand tends to lower solder heat resistance under moisture absorption. This tendency helds good for all types of epoxy resins although a slight difference is seen depending on the base skeleton of the epoxy resin or the aromatic polyamine used. It is generally believed that the peeling strength between interlayer circuit board and prepreg practically required for the epoxy-based multilayer printed circuit boards(such as FR-4 grade) is 0.6 kN/m or above. When an epoxy resin having an average epoxy equivalent of 450 was used, the peeling strength between interlayer circuit board and prepreg without black oxide treatment was 0.7 kN/m, which is above the practically acceptable level. When using a resin having a weight-average epoxy equivalent of more than 6,000, although the peeling strength between interlayer circuit board and prepreg (without black oxide treatment) is as high as 1.1 kN/m, the required heat resistance under moisture absorption can not be obtained because of too much spacing between the epoxy groups at the site of crosslinkage.

Imidazole curing accelerators, which are popular curing accelerators for epoxy resins, are used as a curing agent or curing accelerator for the improvement of curing characteristics of the undercoating agent. In the present invention, for the improvement of heat resistance under moisture absorption and interlaminar adhesion, 2-undecylimidazole, 1-cyanoethyl-2-undecylimidazole and 2,4-diamino-6-{2'-undecylimidazole(1')} ethyl-s-triazine are used either singly or in admixture in an amount of preferably 0.2 to 2.5 parts by weight per 100 parts by weight of the epoxy resin. When the imidazole amount exceeds 2.5 parts by weight, curing takes place too fast, resulting in poor moldability and making it difficult to obtain desired solder heat resistance under moisture absorption and/or desired interlaminar adhesion. On the other hand, when the imidazole amount is less than 0.2 parts by weight, curing of the resin becomes imperfect, which leads to unsatisfactory heat resistance and reduced adhesion property. In case an aromatic polyamine such as mentioned below is blended, the amount of said imidazole compound is preferably 0.2 to 0.9 parts by weight per 100 parts by weight of the epoxy resin. When the imidazole amount exceeds 0.9 parts by weight, curing takes place too fast, resulting in poor moldability and making it difficult to obtain desired solder heat resistance under moisture absorption and/or interlaminar adhesion. On the other hand, when the imidazole amount is less than 0.2 parts by weight, curing of the resin becomes imperfect, which leads to unsatisfactory heat resistance and reduced adhesion property.

An aromatic polyamine can be blended in where even a higher adhesion property to copper foil in interlayer circuit board is desired. Examples of the aromatic polyamines usable in the present invention include 4,4'-diaminodiphenylmethane, 4,4'-diaminodiphenylsulfone, methaphenylenediamine, 4,4'-diamino-3,3'-diethyl-5,5'-dimethyldiphenylmethane, 3,3'-dimethoxy-4,4'-diaminodiphenyl, 3,3'-dimethyl-4,4'-diaminodiphenyl, 2,2'-dichloro-4,4'-diamino-5,5'-dimethoxydiphenyl, 2,2',5,5'-tetrachloro-4,4'-diaminodiphenyl, 4,4'-methylene-bis(2-chloroaniline), 2,2', 3,3'-tetrachloro-4,4'-diaminodiphenylmethane, bis(4-amino-2-chloro-3,5-diethyldiphenyl)methane, 4,4'-diaminodiphenyl ether, 3,4'-diaminodiphenyl ether, 4,4'-diaminobenzanilide, 3,3'-dihydroxy-4,4'-diaminobiphenyl, 9,9'-bis(4-aminophenyl) fluorene, and 9,10-bis(4-aminophenyl)anthracene.

In case an aromatic polyamine having sulfide linkage, sulfone linkage, sulfoxide linkage or ether linkage is used as a curing agent, adhesion property to copper foil without black oxide treatment is improved approximately 10 to 20%, as compared with the case using an aromatic polyamine not having such linkage, although it is somewhat disadvantageous in terms of cost. It can be understood that such an effect of said aromatic polyamine is due to high chemical affinity of the linkage although any of said types of linkage does not directly constitute a chemical bond with the copper element having an oxidation number of 0. Examples of the aromatic polyamines having sulfide, sulfone or sulfoxide linkage include diaminodiphenylsulfone, 2,2-bis[4-(4-aminophenoxy)phenyl]sulfone, 3,3'-dimethyl-4,4'-diaminobiphenyl-6,6'-sulfone, 2,2-bis(4-aminophenyl) sulfoxide, 2,2-bis[4-(4-aminophenoxy)phenyl]sulfoxide, 3,3'-dimethyl-4,4'-diaminobiphenyl-6,6'-sulfoxide, and diaminodiphenyl sulfide.

Exemplary of the aromatic polyamines having ether linkage are 4,4'-diaminodiphenyl ether, bis[4-(4-aminophenoxy) phenyl]ether, 4,4'-bis(4-aminophenoxy)biphenyl, and 1,4-bis(4-aminophenoxy)benzene.

The aromatic polyamine in this invention is added in an amount of preferably 0.1 to 2.5 equivalents to one equivalent of the epoxy resin, more preferably 0.5 to 1.5 equivalents to one equivalent of the epoxy resin for obtaining both of desired heat resistance (particularly solder heat resistance under moisture absorption) and desired interlaminar adhesion. Usually an equivalent ratio of aromatic polyamine to epoxy resin is around 1, but in the present invention, the aromatic polyamine can be used in a higher or lower ratio. It should be noted, however, that a higher or lower equivalent ratio than the above range tends to invite a reduction of heat resistance and adhesion property.

In case of using the aromatic polyamine having sulfide, sulfone or sulfoxide linkage, equivalent ratio of the polyamine to the epoxy resin preferably falls within the range of from 1.5 to 2.5 for obtaining both desired heat resistance (particularly solder heat resistance under moisture absorption) and desired interlaminar adhesion. Usually an equivalent ratio of aromatic polyamine to epoxy resin is around 1, but in the present invention it is desirable that said equivalent ratio is more than 1. It should be noted, however, that a higher or lower equivalent ratio than the above range tends to invite a reduction of heat resistance and adhesion property. In the case of the aromatic polyamine having ether linkage, it is preferable that the equivalent ratio of the polyamine to the epoxy resin falls within the range of from 0.5 to 1.5 for attaining said both desired properties.

When the above-described undercoating agent is coated on an interlayer circuit board, the viscosity of the undercoating agent can be adjusted by the use of a solvent. As the solvent, there can be used, for instance, actone, methyl ethyl ketone, toluene, xylene, ethylene glycol monoethyl ether and its acetates, propylene glycol monoethylether and its acetates, dimethylformamide, methyl diglycol, ethyl diglycol, methanol, ethanol and the like.

It is also possible to add an inorganic filler to the undercoating agent for providing thixotropic properties or heat resistance. Exemplary of such inorganic fillers are aluminum hydroxide, magnesium hydroxide, alumina, antimony oxide, barium titanate, colloidal silica, calcium carbonate, calcium sulfate, mica, silica, silicon carbide, talc, titanium oxide, quartz, zirconium oxide, zirconium silicate, boron nitride, carbon, graphite and the like.

A coupling agent may be added to the undercoating agent for improving adhesion property to copper and/or inorganic filler. As the coupling agent, there can be used silane coupling agents, titanate-based coupling agents, alumichilate-based coupling agents, etc., the typical examples thereof being chloropropyltrimethoxysilane, vinyltrichlorosilane, γ-glycidoxypropyltrimethoxysilane, γ-mercaptopropyltrimethoxysilane, N-β(aminoethyl)γ-aminopropyltrimethoxysilane, γ-ureidopropyltriethoxysilane, isopropyltriisostearoyl titanate, isopropyltrimethacryl titanate, isopropyltri (dioctylphillophosphate) titanate, and isopropylisostearoyldi (4-aminobenzoyl) titanate.

Further, in order to provide anti-foaming or foaming breaking properties, silicone-based anti-foaming agent, an acrylic anti-foaming agent, a fluorine-based surfactant or the like may be added to the undercoating agent. It is generally known that increase of toughness is an important factor for the improvement of peeling strength between interlayer circuit board and prepreg. For this purpose, it is possible to add a carboxy-terminated butadiene acrylonitrile rubber (such as CTBN available from Ube Industries, Ltd.), an epoxy-modified polybutadiene rubber or the like to the undercoating agent.

Such undercoating agent may be applied in the conventional coating methods such as roll coating, curtain coating, casting, spin coating and screen printing. Any other method can be employed as far as it is capable of uniform coating of the surface of the interlayer circuit board. Since there is optimum viscosity of the undercoating agent, it is necessary to properly select or adjust the type of the reactive diluent and solvent, the type, particle size, and amounts added of the inorganic filler and other additives depending on the coating method employed.

The undercoat thickness is variable depending on the coating method, the copper foil thickness of the interlayer circuit board, etc. For instance, the thickness may be 10–50 μm, but this of course is not definitive.

Cured state of the undercoating agent coated on the interlayer circuit board before lamination with the prepreg is discussed below. The cured state of thermosetting resin is generally classified into the following "stages": "A stage" where the agent composition is in a totally uncured state, "B stage" which signifies a semi-cured state, "gel stage" which indicates a further advanced state of curing than B stage, and "C stage" where the agent composition has been perfectly cured. Even if the undercoating agent is in any of these stages, the interlayer circuit board (coated with the agent) can be used to laminate with prepreg in the present invention, but the agents in a tack-free state or in B stage, or sometimes in a state in which the curing reaction is further advanced to gel stage, are preferred because of easy handling.

The prepreg in the present invention is obtained by impregnating a thermosetting resin in a base material and preferably drying the same in the following manner. A typical example of the thermosetting resins usable here is the conventional epoxy resins which have been generally employed for the purpose of electrical insulation, and which include, for instance, bisphenol A type epoxy resins, bisphenol F type epoxy resins, bisphenol S type epoxy resins, phenolic novolak type epoxy resins, orthocresol novolak type epoxy resins, isocyanurate type epoxy resins, all of which have two or more epoxy groups in the molecule, trifunctional or tetrafunctional glycidylamine type epoxy resins, epoxy resins having a biphenyl skeleton, epoxy resins having a naphthalene skeleton, epoxy resins having a cyclopentadiene skeleton, epoxy resins having a limonene skeleton, and bromides thereof. These epoxy resins may be used either singly or as a mixture. Usually the epoxy resin used for said purpose contains a typical curing agent such as aromatic polyamines, dicyandiamides, acid anhydrides, etc., and a typical curing accelerator such as imidazoles, adduct of imidazoles, phosphines, tertiary amines, and microcapsulated versions thereof.

Impregnation may be carried out after forming a solution of the thermosetting resin by dissolving the thermosetting resin in a solvent. As the solvent, there can be used, for instance, acetone, methyl ethyl ketone, methyl cellosolve, dimethylformamide and the like. A resin content of the thermosetting resin solution is not specified, but it is preferably in the range of from 30 to 60% by weight. The impregnation temperature may, for instance, be in the range of from 0° C. to 40° C., but it is not specifically defined as far as it allows sufficient impregnation of the thermosetting resin in the base material. The drying temperature for the base material impregnated with the thermosetting resin is also not specified, but it is preferably in the range of from 100° C. to 210° C., more preferably from 150° C. to 180° C.

The base material used for the preparation of the prepreg may in this invention is not specified though glass cloth may be cited as a preferred example. The thickness of the base material is not defined, but it is preferably in the range of from 30 to 300 μm, more preferably from 50 to 210 μm. The resin content in the prepreg after impregnation and drying is also not specified, but it is preferably in the range of from 30 to 70% by weight, more preferably from 45 to 55% by weight.

According to the present invention, the prepreg obtained in the manner described above is laid (placed) on at least one circuit side of the interlayer circuit board, on at least one side of which circuit has been formed, and subjected to laminating press in the following way. The prepreg may be placed on either one circuit side or both circuit sides of the interlayer circuit board. Plural sheets of the prepreg may be placed. Laminating press may be carried out, for example, under the conditions of 40–80 kg/cm² and 150–180° C. for a period of about 60 minutes or more, but the pressure, temperature and time for this laminating press are not limited to said conditions. As the method for producing a copper clad laminate having yet no circuit therein, there may, for example, be employed a method in which one sheet or plural sheets of the prepreg produced in the manner described above and a copper foil are laminated and press under the above-specified conditions. The thickness of the copper foil is not specified, but it is preferably in the range of from 9 to 105 μm, more preferably from 35 to 70 μm. The thickness of the copper-clad laminate is not specified, but it is preferably in the range of from 30 to 2,000 μm, more preferably from 100 to 1,600 μm. Various methods may be employed for forming circuit on the copper-clad laminate. For instance, an etching resist is applied in the form of the circuit pattern on the copper-clad laminate by screen printing, and then etching is carried out, followed by removal of the resist.

The oxidation treatment (black oxide treatment) of the interlayer circuit board is usually carried out by soft-etching the surface of the interlayer circuit board with an oxidizing agent which is not so strong, such as a peroxide, washing the etched surface with an acid such as dilute hydrochloric acid (acid treatment), followed by an oxidation treatment and drying the treated surface. As the oxidizing agent for the surface oxidation treatment, there can be used, for instance, an alkali solution of sodium chlorite and sodium phosphate (e.g. a sodium hydroxide alkali solution). The oxidation treatment temperature may be, for instance, 70–90° C.

The use of the undercoating agent in the present invention can unnecessitate the black oxide treatment which has been essential in the conventional methods for manufacturing the multilayer printed circuit boards. This can reduce the production cost and manhour required for quality control in the process of black oxide treatment. Also, since there is no possibility of causing haloing because of no black oxide treatment, it is possible to easily make high-density circuit. Further, in forming the layer of an undercoating agent on the circuit surface of the interlayer circuit board, the recessions between the circuits are filled up with the undercoating agent. This ensures perfect molding of the multilayer printed circuit board, with no fear of leaving air cells, when the prepreg is laminated on the interlayer circuit board. This contributes to eliminating the necessity of changing the resin content and its fluidity in the prepreg according to the retention ratio of the copper foil in the interlayer circuit in the conventional procedures. Specifically, since the thickness precision of a multilayer printed circuit board is not dependent on the copper foil retention ratio on the interlayer circuit, it has become possible to accommodate the variety of interlayer circuit boards by use of limited types of prepreg, and this has enabled reduction of the types of prepreg required for the manufacture of multilayer printed circuit board.

Further, the time required for filling up the recessions between the circuits of the interlayer circuit board with a resin of the prepreg is unnecessitated or reduced. In the prior art, since the heating rate has been set at 2–5° C./min for the necessity of securing the sufficient time for defoaming, the molding time in laminating and molding operation has required 140 minutes or more. According to the present invention, since the heating rate can be increased to as high as 6–15° C./min, the molding time could be reduced to about 80 minutes or less. This results in a remarkable reduction of production cost as well as manhour required for the control of quality and stocking of the products.

The present invention is further illustrated by the following examples. The examples are not to be construed in anyway as limited the scope of this invention.

EXAMPLE

Example 1

To a solution of 100 parts by weight of a bisphenol A type epoxy resin (epoxy equivalent: 925) in 120 parts by weight of butyl cellosolve acetate, 0.8 parts by weight of 2,4-diamino-6-{2'-undecylimidazole(1')}ethyl-s-triazine was added and dissolved. Then 80 parts by weight of calcium carbonate having an average particle size of 1–2 μm, which has been subjected to a hydrophobicity-imparting treatment, 20 parts by weight of ultrafine particulate silica and one part by weight of γ-glycidoxypropyltrimethoxysilane were added and the mixture was kneaded by a three-roll mill and deaerated by a vacuum deaerator in a vacuum of 3 mmHg for 5 minutes to obtain an undercoating agent.

Next, a both side-copper-clad glass-reinforced epoxy resin-laminate having a substrate thickness of 0.1 mm and a copper foil thickness of 35 μm was polished on the surface and soft etched to remove the anticorrosive coating, and circuit was formed by etching. Usually circuit formation is followed by a black oxide treatment, but no such black oxide treatment was conducted and said undercoating agent was screen printed on one circuit side of the interlayer sheet and heated in a dryer at 120° C. for 5 minutes to produce a tack-free condition. A similar undercoat was also formed on the opposite side and dried.

A sheet of a 100 μm thick FR-4 prepreg (EI-6765 available from Sumitomo Bakelite Co., Ltd.) obtained by impregnating an epoxy resin in glass cloth and drying the same, was placed on both sides of the undercoating agent-applied interlayer circuit board, then a sheet of 18 μm thick copper foil was overlaid thereon and the assembly was subjected to hot press under vacuum to effect heat curing of the prepreg over a period of 80 minutes including the heating and cooling times with the ultimate temperature of the assembly being set at 170° C. to obtain a multilayer printed circuit board. Property evaluations of this circuit board gave the results shown in Table 1. No haloing was observed during through-hole plating since no oxidation treatment was conducted on the interlayer circuit board.

Examples 2–12

The procedure of Example 1 was followed except that resin composition of the undercoating agent was changed as shown in Table 1 to make the multilayer printed circuit boards and their properties were evaluated. The resin compositions and the evaluation results are shown in Table 1. No halo phenomenon was observed as in Example 1.

TABLE 1

|  | Example | | | | | |
|---|---|---|---|---|---|---|
|  | 1 | 2 | 3 | 4 | 5 | 6 |
| Bisphenol A type epoxy resin (wt %) | | | | | | |
| Epoxy equivalent 925 | 100 | 100 | | | 50 | 100 |
| Epoxy equivalent 1975 | | | 100 | | | |
| Epoxy equivalent 2850 | | | | 100 | 50 | |
| Curing agent (equivalent ratio to epoxy resin) | | | | | | |
| 4,4'-Diaminodiphenyl sulfide | | | | | | 1.75 |
| 2,2'-Bis[4-(4-aminophenoxy)-phenyl]sulfone | | | | | | |
| 4,4'-Diaminodiphenyl ether | | | | | | |
| 4,4'-Diamino-3,3'-diethyl-5,5'-dimethyldiphenylmethane | | | | | | |
| Curing accelerator (PHR) | | | | | | |
| C1lC | | 0.8 | | | | |
| C1lZ•A | 0.8 | | 1.5 | | 0.8 | 0.5 |
| C1lZ•CN | | | | 1.5 | | |
| Filler (PHR) | | | | | | |
| Hydrophobic calcium carbonate | 80 | 80 | 80 | 80 | 80 | 80 |
| Ultrafine particulate silica | 20 | 20 | 20 | 20 | 20 | 20 |
| Undercoating agent | Applied | Applied | Applied | Applied | Applied | Applied |
| Black oxide treatment | Not conducted | Not conducted | Not conducted | Not conducted | Not conducted | Not conducted |
| Heating rate in multilayer molding (° C./min) | 8 | 8 | 8 | 8 | 8 | 8 |
| Multilayer molding time (min) | 80 | 80 | 80 | 80 | 80 | 80 |
| Moldability (void formation rate) (%) | 4 | 5 | 7 | 8 | 7 | 6 |
| Interlaminar adhesion (N/m) | 0.90 | 0.85 | 1.00 | 1.00 | 1.05 | 1.20 |
| Soldar heat resistance under moisture absorption (blister occurrence rate %) | 0 | 0 | 10 | 0 | 10 | 0 |

|  | Example | | | | | |
|---|---|---|---|---|---|---|
|  | 7 | 8 | 9 | 10 | 11 | 12 |
| Bisphenol A type epoxy resin (wt %) | | | | | | |
| Epoxy equivalent 925 | 100 | 100 | | | 50 | 50 |
| Epoxy equivalent 1975 | | | 100 | | | |
| Epoxy equivalent 2850 | | | | 100 | 50 | 50 |
| Curing agent (equivalent ratio to epoxy resin) | | | | | | |
| 4,4'-Diaminodiphenyl sulfide | | | 2.0 | | 1.75 | |
| 2,2'-Bis[4-(4-aminophenoxy)-phenyl]sulfone | 1.5 | | | | | |
| 4,4'-Diaminodiphenyl ether | | 1.0 | | 1.0 | | 1.0 |
| 4,4'-Diamino-3,3'-diethyl-5,5'-dimethyldiphenylmethane | | | | | | |
| Curing accelerator (PHR) | | | | | | |
| C1lC | 0.5 | | 0.5 | | 0.5 | |
| C1lZ•A | | | | 0.5 | | 0.5 |
| C1lZ•CN | | 0.5 | | | | |
| Filler (PHR) | | | | | | |
| Hydrophobic calcium carbonate | 80 | 80 | 80 | 80 | 80 | 80 |
| Ultrafine particulate silica | 20 | 20 | 20 | 20 | 20 | 20 |
| Undercoating agent | Applied | Applied | Applied | Applied | Applied | Applied |
| Black oxide treatment | Not conducted | Not conducted | Not conducted | Not conducted | Not conducted | Not conducted |
| Heating rate in multilayer molding (° C./min) | 8 | 8 | 8 | 8 | 8 | 8 |
| Multilayer molding time (min) | 80 | 80 | 80 | 80 | 80 | 80 |
| Moldability (void formation rate) (%) | 8 | 5 | 4 | 5 | 3 | 3 |
| interlaminar adhesion (N/m) | 1.05 | 0.85 | 1.15 | 1.10 | 1.10 | 1.15 |

TABLE 1-continued

| | | | | | | |
|---|---|---|---|---|---|---|
| Soldar heat resistance under moisture absorption (blister occurrence rate %) | 10 | 10 | 0 | 0 | 0 | 0 |

CllZ: 2-undecyclymidazole
CllZ•A: 2,4-diamino-6-{2'-undecylimidazole(1')}ethyl-s-triazine
CllZ•CN: 1-cyanoethyl-2-undecylimidazole

Comparative Example 1

An undercoating agent was produced according to the process of Example 1 except for use of 2-ethyl-4-methylimidazole as the curing accelerator, and by using this undercoating agent, a multilayer printed circuit board was made by following the procedure of Example 1. The property evaluation results of the board are shown in Table 2. No haloing was observed as in the preceding Examples.

Comparative Examples 2–8

Multilayer printed circuit boards were made by following the procedure of Comparative Example 1 except that resin composition of the undercoating agent was changed as shown in Table 2, and the properties of the boards were evaluated. The resin compositions and the evaluation results are shown in Table 2. No haloing was observed as in the preceding Examples.

Comparative Example 9

A multilayer printed circuit board was made according to the procedures of the preceding Examples and Comparative Examples except that no undercoating agent was applied and that anoxidation treatment was conducted on the interlayer circuit board. The property evaluation results are shown in Table 2. Haloing was formed since an oxidation treatment was conducted on the circuit surface.

Comparative Example 10

The procedure of Comparative Example 1 was followed except that an oxidation treatment (black oxide treatment) was applied on the circuit surface of the interlayer circuit board to make a multilayer printed circuit board. The property evaluation results are shown in Table 2. Haloing was observed as an oxidation treatment was performed on the circuit surface.

TABLE 2

| | Comparative Example | | | | |
|---|---|---|---|---|---|
| | 1 | 2 | 3 | 4 | 5 |
| Bisphenol A type epoxy resin (wt %) | | | | | |
| Epoxy equivalent 925 | 100 | 100 | | | |
| Epoxy equivalent 1975 | | | 100 | 100 | |
| Epoxy equivalent 2850 | | | | | 100 |
| Curing agent (equivalent ratio to epoxy resin) | | | | | |
| 4,4'-Diaminodiphenylmethane | 1.0 | | 1.0 | | 1.0 |
| 4,4'-Diamino-3,3'-diethyl-5,5'-dimethyldiphenylmethane | | 1.0 | | 1.0 | |
| Curing accelerator (PHR) ZE4MZ | 0.5 | 0.5 | 0.5 | 0.5 | 0.5 |
| Filler (PHR) | | | | | |
| Hydrophobic calcium carbonate | 80 | 80 | 80 | 80 | 80 |
| Ultrafine particulate silica | 20 | 20 | 20 | 20 | 20 |
| Undercoating agent | Applied | Applied | Applied | Applied | Applied |
| Black oxide treatment | Not conducted | Not conducted | Not conducted | Not conducted | Not conducted |
| Heating rate in multilayer molding (° C./min) | 8 | 8 | 8 | 8 | 8 |
| Multilayer molding time (min) | 80 | 80 | 80 | 80 | 80 |
| Moldability (void formation rate) | 0 | 10 | 0 | 10 | 10 |
| Interlaminar adhesion (N/m) | 0.45 | 0.40 | 0.50 | 0.45 | 0.50 |
| Solder heat resistance under moisture absorption (blister occurrence rate %) | 100 | 90 | 100 | 80 | 100 |

| | Comparative Example | | | | |
|---|---|---|---|---|---|
| | 6 | 7 | 8 | 9 | 10 |
| Bisphenol A type epoxy resin (wt %) | | | | | |
| Epoxy equivalent 925 | | 50 | 50 | — | 50 |
| Epoxy equivalent 1975 | | | | | |
| Epoxy equivalent 2850 | 100 | 50 | 50 | — | 50 |
| Curing agent | | | | | |

TABLE 2-continued

| (equivalent ratio to epoxy resin) | | | | | |
|---|---|---|---|---|---|
| 4,4'-Diaminodiphenylmethane | | 1.0 | | | |
| 2,2'-Diamino-3,3'-diethyl-5,5'-dimethyldiphenylmethane | 1.0 | | 1.0 | | 1.0 |
| Curing accelerator (PHR) 2E4MZ | 0.5 | 0.5 | 0.5 | — | 0.5 |
| Filler (PHR) | | | | | |
| Hydrophobic calcium carbonate | 80 | 80 | 80 | — | 80 |
| Ultrafine particulate silica | 20 | 20 | 20 | — | 20 |
| Undercoating agent | Applied | Applied | Applied | Not Applied | Applied |
| Black oxide treatment | Not conducted | Not conducted | Not conducted | Conducted | Conducted |
| Heating rate in multilayer molding (° C./min) | 8 | 8 | 8 | 8 | 8 |
| Multilayer molding time (min) | 80 | 80 | 80 | 80 | 80 |
| Moldability (void formation rate) | 20 | 0 | 0 | 50 | 0 |
| Interlaminar adhesion (N/m) | 0.45 | 0.45 | 0.50 | 0.90 | 0.90 |
| Solder heat resistance under moisture absorption (blister occurrence rate %) | 70 | 90 | 80 | 0 | 0 |

2E4MZ: 2-ethyl-4-methylimidazole

Measuring methods

1. Moldability

A multilayer printed circuit board was prepared by using an interlayer circuit board having 100 pieces of 20-mm-diameter circular sections (A) to have been etched. After etching the surface copper foil, the board was examined to see whether voids were formed or not in the sections (A) and the rate of formation of voids (%) was determined from the number of the sections (A) where voids were formed.

2. Interlaminar adhesion

A multilayer printed circuit board was prepared by following the procedure of the Examples or Comparative Examples except that an interlayer circuit board having circuit formed on one side alone was used. The prepreg was peeled from the interlayer circuit board, measuring the peeling strength, and this peeling strength was given as an indication of interlaminar adhesion.

3. Solder heat resistance under moisture absorption

The multilayer printed circuit board was subjected to a PCT treatment at 125° C. for 30 minutes (pressure cooker test: saturated steam treatment under heating), then dipped in a 260° C. solder bath for 20 seconds and visually checked for the presence or absence of blister.

The process for producing multilayer printed circuit boards according to the present invention is capable of providing high adhesion property of the undercoating agent to copper foil, resulting in the unnecessary black oxide treatment which has been necessary in manufacture of the multilayer printed circuit boards according to the conventional methods. Therefore, there is no possibility of causing haloing, so that the circuit boards produced according to the process of this invention are capable of high-density circuit with ease, and also an appreciable reduction of production cost and manhour required for quality control in the process of black oxide treatment can be realized. Further, since an undercoating agent is beforehand applied to fill the recessions of the interlayer circuit board, there is eliminated any possibility of leaving the air cells that could otherwise be formed in the recessions, so that no voids are formed in the circuit board and good moldability can be obtained without long-time vacuum pressing required in the prior art. Moreover, as there is no need of changing the type of prepreg according to the copper foil retention rate in the interlayer circuit board, the multilayer printed circuit board production time can be remarkably shortened. Furthermore, the multilayer printed circuit boards obtained by the aforesaid process can be applied to cameras, facsimiles, duplicating machines, word processors and computers.

What is claimed is:

1. A multilayer printed circuit board comprising an interlayer circuit board laminated to a prepreg,
   wherein the prepreg is obtained by impregnating a base material with a thermosetting resin,
   the multilayer printed circuit board is obtained by applying an undercoating agent comprising
   (a) a terminal-bifunctional linear epoxy resin having an average epoxy equivalent of from 450 to 6,000,
   (b) optionally a polyamine,
   (c) at least one imidazole component selected from the group consisting of 2-undecylimidazole, 1-cyanoethyl-2-undecylimidazole and 2,4-diamino-6-{2'-undecyl-imidazole(1')}ethyl-s-triazine
to at least one circuit side of an interlayer circuit board on at least one side of which a circuit has been formed, laying the prepreg on at least one side of the undercoating agent-applied interlayer circuit board and subjecting them to laminating.

2. The multilayer printed circuit board according to claim 1, wherein the interlayer circuit board, prior to application of the undercoating agent, is subjected to no oxidation treatment.

3. In a process for using a multilayer printed circuit board in the manufacture of a camera, facsimile machine, duplicating machine, word processor or computer, the improvement wherein said printed circuit board is in accordance with claim 2.

4. A process for using a multilayer printed circuit board, comprising the step of applying the multilayer printed circuit board according to claim 1 to cameras, facsimiles, duplicating machines, word processors or computers.

5. The multilayer printed circuit board according to claim 1, wherein said undercoating agent does not include said optional polyamine.

6. The multilayer printed circuit board according to claim 5 consisting essentially of said interlayer circuit board in the form of a copper-clad laminate having a thickness of 30–2000 μm, said prepreg having a thickness of 30–300 μm, and between said prepreg and said multilayer printed circuit board a layer of said undercoating agent having a thickness of 10–50 μm.

7. The multilayer printed circuit board according to claim 1, wherein said undercoating agent consists essentially of said (a) terminal-bifunctional linear epoxy resin and said (c) at least one imidazole component, and optionally said (b) polyamine.

8. The multilayer printed circuit board according to claim 1, wherein said undercoating agent consists of (a) said terminal-bifunctional linear epoxy resin and (c) said at least one imidazole compound, and optionally one or more of (b) said polyamine, a solvent, an antifoaming agent, a surfactant, a rubbery toughening agent, and an inorganic filler with or without a coupling agent.

9. A multilayer printed circuit board comprising an interlayer circuit board laminated to a prepreg, wherein the prepreg is obtained by impregnating a base material with a thermosetting resin, the multilayer printed circuit board is obtained by applying an undercoating agent comprising (a) a terminal-bifunctional linear epoxy resin having an average epoxy equivalent of from 450 to 6,000, (b) optionally a polyamine, (c) at least one imidazole component selected from the group consisting of 2-undecylimidazole, 1-cyanoethyl-2-undecylimidazole and 2,4-diamino-6-{2'-undecyl-imidazole(1')}ethyl-s-triazine to a circuit side of an interlayer circuit board on which a copper circuit has been formed, wherein said undercoating agent is in direct contact with said copper of said printed circuit board, laying the prepreg on the undercoating agent-applied interlayer circuit board, and subjecting them to laminating.

10. A multilayer printed circuit board comprising an interlayer circuit board and a prepreg, wherein the prepreg is obtained by impregnating a base material with a thermosetting resin and the multilayer printed circuit board is obtained by applying an undercoating agent comprising (a) a terminal-bifunctional linear epoxy resin having an average epoxy equivalent of from 450 to 6,000, (b) an aromatic polyamine and (c) at least one imadazole component selected from the group consisting of 2-undecylimidazole, 1-cyanoethyl-2-undecylimidazole and 2,4-diamino-6-{2'-undecyl-imidazole(1')}ethyl-s-triazine to at least one circuit side of an interlayer circuit board on at least one side of which a circuit has been formed, laying the prepreg on at least one side of the undercoating agent-applied interlayer circuit board and subjecting them to laminating.

11. The multilayer printed circuit board according to claim 10, wherein the interlayer circuit board is subjected to no oxidation treatment.

12. The multilayer printed circuit board according to claim 10, wherein the aromatic polyamine (b) has sulfide linkage, sulfone linkage, sulfoxide linkage or ether linkage.

13. The multilayer printed circuit board according to claim 12, wherein the interlayer circuit board is subjected to no oxidation treatment.

14. In a process for using a multilayer printed circuit board in the manufacture of a camera, facsimile machine, duplicating machine, word processor or computer, the improvement wherein said printed circuit board is in accordance with claim 11.

* * * * *